United States Patent
Boniardi et al.

(10) Patent No.: US 11,024,372 B2
(45) Date of Patent: Jun. 1, 2021

(54) SEGREGATION-BASED MEMORY

(71) Applicant: Micron Technology, Inc., Boise, ID (US)

(72) Inventors: Mattia Boniardi, Cormano (IT); Agostino Pirovano, Milan (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/102,493

(22) Filed: Aug. 13, 2018

(65) Prior Publication Data
US 2020/0051626 A1 Feb. 13, 2020

(51) Int. Cl.
*G11C 13/00* (2006.01)

(52) U.S. Cl.
CPC ........ *G11C 13/0004* (2013.01); *G11C 13/004* (2013.01); *G11C 13/0069* (2013.01); *G11C 2013/009* (2013.01)

(58) Field of Classification Search
CPC .................................................. G11C 13/0004
See application file for complete search history.

(56) References Cited

U.S. PATENT DOCUMENTS

| | | | |
|---|---|---|---|
| 2008/0057180 A1* | 3/2008 | Weiss | B05C 11/1034 427/8 |
| 2008/0094875 A1* | 4/2008 | Ho | B82Y 10/00 365/148 |
| 2008/0158940 A1* | 7/2008 | Suh | G11C 13/0004 365/163 |
| 2008/0298114 A1* | 12/2008 | Liu | G11C 11/56 365/148 |
| 2010/0012913 A1* | 1/2010 | Lee | G11C 11/56 257/2 |
| 2010/0284211 A1 | 11/2010 | Hennessey | |
| 2011/0305075 A1 | 8/2011 | Lowrey et al. | |
| 2013/0044537 A1 | 2/2013 | Ishigaki et al. | |
| 2015/0207066 A1* | 7/2015 | Ohba | H01L 27/2463 257/4 |

FOREIGN PATENT DOCUMENTS

KR 20080062765 A 7/2008

OTHER PUBLICATIONS

The Korean Intellectual Property Office, "Notice of Allowance" issued in connection with Korean Patent Application No. 10-2019-0098193, dated Dec. 18, 2020 (4 pages).

* cited by examiner

*Primary Examiner* — Douglas King
(74) *Attorney, Agent, or Firm* — Holland & Hart LLP

(57) ABSTRACT

Methods, systems, and devices for operating memory cell(s) are described. A resistance of a storage element included in a memory cell may be programmed by applying a voltage to the memory cell that causes ion movement within the storage element, where the storage element remains in a single phase and has different resistivity based on a location of the ions within the storage element. In some cases, multiple of such storage elements may be included in a memory cell, where ions within the storage elements respond differently to electric pulses, and a non-binary logic value may be stored in the memory cell by applying a series of voltages or currents to the memory cell.

18 Claims, 8 Drawing Sheets

SEGREGATION-BASED MEMORY

BACKGROUND

The following relates generally to operating a memory system and more specifically to segregation-based memory (SBM).

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

PCM may store different logic values using materials that exhibit different resistances at different material phases—e.g., an amorphous phase may correspond to a first logic value and a crystalline phase may correspond to a second logic value. The phase of a material may also be referred to as a state of the material—e.g., an amorphous state or crystalline state. In some cases, due to timing or other constraints of wide bandgap materials, PCM may use narrow bandgap materials instead of wide bandgap materials, despite the smaller memory windows that narrow bandgap materials may provide.

DETAILED DESCRIPTION

Figure 1:
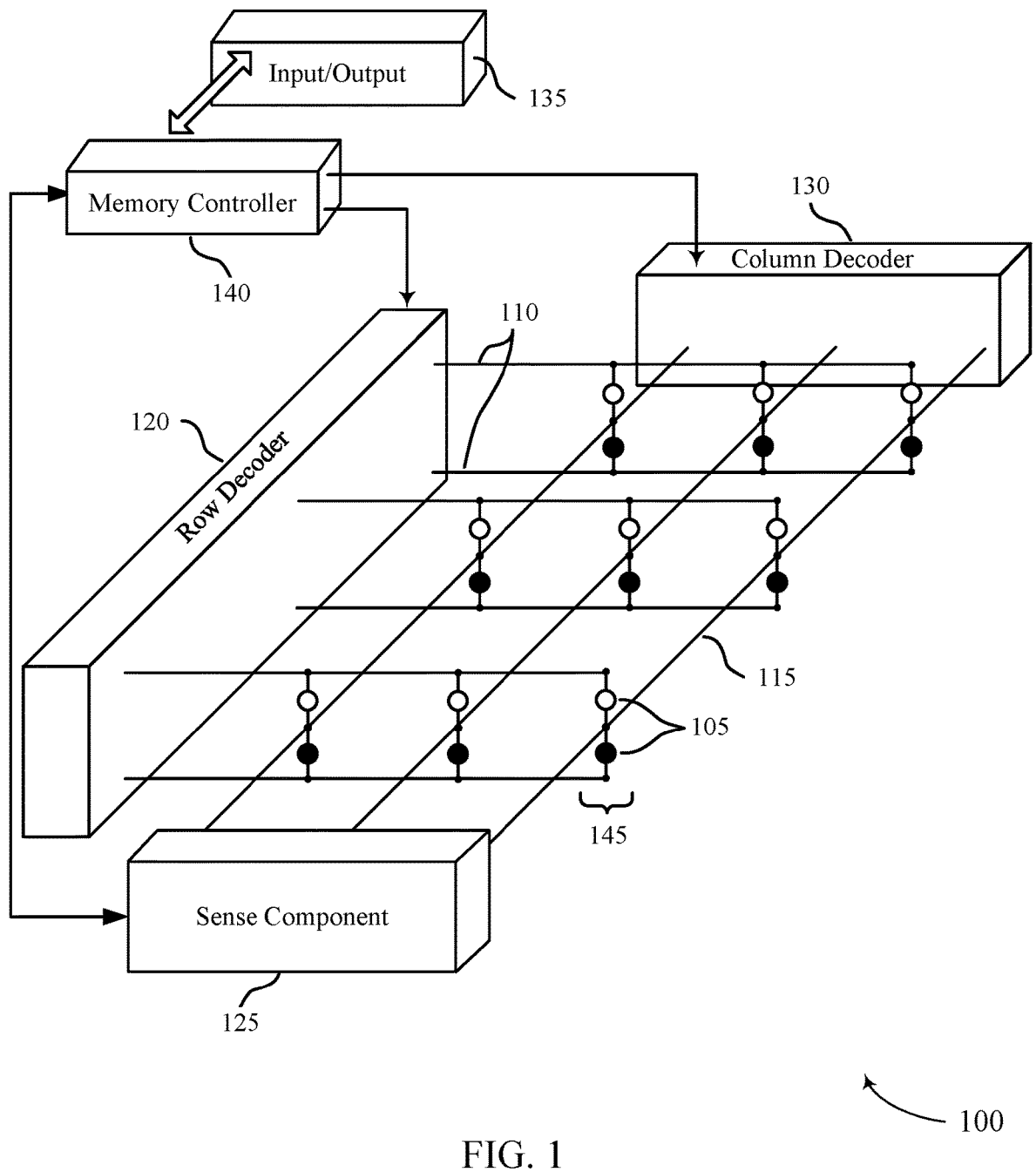
FIG. 1 illustrates an example of a memory array that supports the operation of segregation-based memory (SBM) in accordance with various aspects of the present disclosure.

Electronic data may be stored in memory cells containing storage elements that are electronically programmable (e.g., by way of applying a voltage or current) to have different resistivity (e.g., a resistance or threshold voltage). Such memory may be referred to as resistive memory. For certain types of resistive memory, a logic value may be stored in a memory cell by changing a resistance of a storage element of the memory cell, where a first resistance of the storage element corresponds to a first logic value and a second resistance of the storage element corresponds to a second logic value. Additionally or alternatively, a logic value may similarly be stored by changing a threshold voltage of the storage element (which in some cases may relate to an observed resistivity of the storage element).

A storage element may be composed of a material having an electronically programmable resistance. Certain materials may have different resistivity based on an electronically programmable phase (or state) of the material. For example, certain materials may exhibit different resistivity based on a phase of the material—e.g., based on whether the material is in an amorphous phase or a crystalline phase. Such materials may be referred to as phase change materials. In some examples, a phase of a phase change material may be changed by applying one or more voltages across (or currents to—e.g., through) the phase change material, heating the material to at least a certain temperature (which may be referred to as the glass transition temperature) and cooling the material (which may also be referred to as quenching) by removing or altering the applied voltage or current so as to cause a phase of the phase change material to transition from one phase to another phase.

In some cases, the glass transition temperature for a particular phase change material may be based on the chemical structure of the phase change material (e.g., certain phase change materials may have higher or lower glass transition temperatures than other phase change materials). The time for transitioning from the amorphous to the crystalline phase may be referred to as the "SET period," and the time for transitioning from the crystalline phase to the amorphous phase may be referred to as the "RESET period." In some cases, the duration of a SET period is based on a bandgap and/or glass transition temperature of a phase change material—e.g., the duration of the SET period may increase with the bandgap and glass transition temperature. Chalcogenide materials may be examples of phase change materials.

Some materials—in addition or in the alternative to being phase change materials—may exhibit different resistivity based on how ions are grouped within the material—e.g., based on whether a majority of ions within the material are at one portion (e.g., in a segregated state) or another portion (e.g., in a migrated state) of the material. Such materials may be referred to as segregable materials.

A change in the resistivity of a segregable material may occur without a phase of the segregable material being changed. In some examples, a location of the ions within a segregable material may be changed by applying voltages across (or currents to) the segregable material, causing the ions to move (e.g., segregate/migrate) to a particular end of the segregable material. The time for transitioning between different segregated states may be referred to as the "segregation period."

In some cases, whether a segregable material experiences ion segregation in response to an applied voltage or current is based on the chemical structure of the segregable material—e.g., certain segregable materials may respond to higher or lower voltages or current than other segregable materials. Ion segregation may occur in response to shorter, lower intensity electric pulses relative to phase change—e.g., since melting of the material does not occur. In some cases, a material may be both a phase change material and a segregable material, and applied electric pulses may be configured to operate the material as either a phase change material by changing the phase of the material or as a segregable material by segregating ions within the material without inducing a phase change. For example, chalcogenide materials may also be examples of segregable materials.

A logic value stored in resistive memory may be determined by sensing a resistivity of a storage element contained in a memory cell. Among other techniques, the resistivity of the storage element may be sensed by applying a voltage to a memory cell and comparing a resulting current with expected currents for possible logic values stored at the memory cell, where the expected currents are determined based on expected resistivity of the storage element for different logic values. In such cases, the larger the difference in resistivity of the storage element between different logic states, the more reliably (e.g., with lower error rates) the logic states may be determined—e.g., because the difference between the measured current and expected currents can be greater. In some examples, the difference between the resistivity of different logic states corresponds to the memory window of a memory cell, and a larger memory window may be desirable.

The bandgap energy of a material may be correlated with a resulting memory window for a memory cell. For instance, for phase change memory (PCM)—a memory system that programs memory cells by changing a phase of the storage elements—phase change materials with wider bandgaps typically provide larger memory windows than phase change materials with narrow bandgaps. But, the SET period for wider bandgap phase change materials is typically longer than the SET period for smaller bandgap phase change materials—e.g., due to higher glass transition temperatures of the wider bandgap phase change materials relative to smaller bandgap phase change materials. In some cases, a duration of the SET period for a wide bandgap phase change material may exceed timing constraints, and a narrower bandgap phase change material may be used instead of the wide bandgap phase change material, despite the narrower bandgap phase change material providing a smaller memory window.

Similar to phase change materials, segregable materials with wider bandgaps may provide larger memory windows than segregable materials with narrower bandgaps. In some examples, a segregation period for a wide bandgap segregable material is shorter than a SET period for a similarly wide bandgap phase change material. In some examples, a segregation period for a material that is both segregable and capable of phase change may satisfy timing constraints that are not satisfied by a SET period for the same material.

In some cases, data may be stored in a memory array using ion segregation techniques instead of phase change techniques—memory that is programmed by inducing ion movement within a storage element may be referred to as segregation-based memory (SBM). This way, larger bandgap materials having short segregation periods may be used in a memory device to provide larger memory windows without violating timing constraints.

Also, certain phase change materials having shorter segregation periods than SET periods may be operated using ion segregation techniques, reducing the latency of a memory device using such materials. Also, since SBM programs storage elements within a single phase (e.g., by raising a temperature of a storage element above its glass transition temperature but without melting the storage element), lower temperatures may be generated during programming (e.g., due to using low intensity current pulses), reducing thermal disturbance in a memory device. Also, as discussed above, relatively short electric pulses may be used to induce ion segregation in a material, reducing latency of a memory device using SBM.

For example, a segregable material (e.g., a chalcogenide material) may be included in a memory cell. To program a resistance of the material, a voltage that causes the ions within the material to move to one portion (e.g., the top or bottom) of the material without changing a phase of the material (e.g., from an amorphous to a crystalline phase, or vice versa) may be applied to the memory cell. That is, a magnitude and duration of the applied voltage that causes ion segregation within a material while heating the material to a temperature that is above a glass transition temperature and below a melting temperature for that material may be used. The magnitude and duration of the applied voltage may also be configured so that, for an applied voltage, the segregation period is shorter than a SET period for the material.

The different segregated states of the material may correspond to different logic values. For instance, a resistance corresponding to the ions moving to a first portion (e.g., the top) of the material may be associated with a first logic value and a resistance corresponding to the ions moving to a second portion (e.g., the bottom) of the material may be associated with a second logic value. This way, a segregable material may be operated to store different logic states without undergoing a phase transition.

As discussed above, the resistivity of different materials may be programmable with different voltages or currents. For example, ions in one segregable material may move in response to an applied voltage (or current) while ions in another segregable material may not move in response to the same applied voltage (or current).

In some cases, multiple materials that are independently programmable may be included in and used as storage elements in a memory cell. This way, the materials may be individually programmed by applying different electric pulses and non-binary data may be stored in a memory array, increasing a memory-density of a corresponding memory device—e.g., the memory device may store more data with little to no increase in the footprint of the memory device.

For example, multiple segregable materials may be included as storage elements in a memory cell. In some cases, a segregable material may function as both a storage element and a selection device for the memory cell. In some examples, one of the segregable materials may have a wide bandgap and a high glass transition temperature while another of the segregable materials alloy may have a narrow bandgap and low glass transition temperature. In some examples, one of the segregable materials is in an amorphous phase and another segregable material is in a crystalline phase. In some examples, each of the segregable materials may be in an amorphous phase. In some examples, each of the segregable materials may be chalcogenide materials.

For example, in a memory cell comprising two segregable materials, a series of voltages or currents may be applied to the memory cell to program the resistivity of the segregable materials.

For example, a first voltage in the series of voltages having a first magnitude (e.g., a relatively high intensity voltage of one polarity, resulting in a relatively high current in one direction) and first duration may be applied to the memory cell, and ions in both of the segregable materials may move to one portion (e.g., the top) of the respective segregable materials. And a second voltage in the series of voltages having a second magnitude (e.g., a relatively low intensity voltage of another polarity, resulting in a relatively low current in another direction) and second duration may be applied to the memory cell, and ions in only one of the segregable materials may move to another portion (e.g., the bottom) of the respective segregable material. In some cases, the first and second duration may be the same. During and after the application of the first and second voltages, both of the segregable materials may remain in the respective state (phase) they were in before the first and second voltages were applied.

The different combinations of segregated states of the segregable materials may correspond to different resistivity combinations, which may correspond to different logic values. In some cases, the different combination of segregated states may correspond to more than two logic values. For example, a resistivity of one segregable material corresponding to the ions moving to a portion (e.g., the top) of the segregable material and a resistivity of the other segregable material corresponding to the ions moving to a portion (e.g., the bottom) of the other segregable material may correspond to a first logic state. A resistance of one segregable material corresponding to the ions moving to a portion (e.g., the top) of the segregable material and a resistance of the other segregable material corresponding to the ions moving to a portion (e.g., the top) of the other segregable material may correspond to a second logic state.

A resistance of one segregable material corresponding to the ions moving to a portion (e.g., the bottom) of the segregable material and a resistance of the other segregable material corresponding to the ions moving to a portion (e.g., the top) of the other segregable material may correspond to a third logic state, and so on. This way, multiple bits of information may be stored by a memory cell by applying particular voltage sequences to the memory cell, increasing the density of a memory array.

Features of the disclosure introduced above are further described below in the context of a memory system. Specific examples of operating a memory system using SBM are then described. These and other features of the disclosure are further illustrated by and described with reference to apparatus diagrams, system diagrams, and flowcharts that relate to SBM.

FIG. 1 illustrates an example of a memory array that supports the operation of SBM in accordance with various aspects of the present disclosure. Memory array 100 may be an example of a memory system and may include memory cells 105 that are programmable to store different states. Each memory cell 105 may be programmable to store two states, denoted a logic 0 and a logic 1. In some cases, each memory cell 105 is configured to store more than two logic states.

A memory cell 105 may include a memory element having programmable states. For example, a memory cell 105 in a DRAM or FeRAM architecture may store a charge representative of the programmable states in a capacitor; for example, in DRAM a charged and uncharged capacitor may represent two logic states, respectively. DRAM architectures may use a capacitor including a dielectric material and having linear electric polarization properties as a memory element. FeRAM architectures may use a similar design as DRAM, but the capacitor used as the memory element may include a ferroelectric material with non-linear polarization properties As another example, a memory cell 105 in a PCM architecture may change a resistivity (e.g., resistance or threshold voltage) of a memory element by changing the phase (state) of the memory element, where a different resistivity may represent a different logic state. Thus, PCM architectures may use, as a memory element, a material having a variable resistance as a function of the phase (state) of the memory element. For example, a material configurable to have a crystalline phase and an amorphous phase with different respective electrical resistances may be used as a memory element. A voltage applied to the memory cell 105 may result in different currents depending on whether the material is in a crystalline or an amorphous phase, and the magnitude of the resulting current may be used to determine the logic state stored by memory cell 105. In some cases, the memory cell 105 may have a combination of crystalline and amorphous areas that may result in intermediate resistances, which may correspond to different logic states (e.g., states other than logic 1 or logic 0) and may allow memory cells 105 to store more than two different logic states. As discussed below, the logic state of a memory cell 105 may be configured in part by heating, including melting, the memory element. In some examples, PCM architectures may use chalcogenide materials as memory elements.

A memory cell 105 in an SBM architecture in accordance with the teachings herein may, however, change a resistivity of a memory element without changing the phase of the memory element by changing the location of ions within the memory element, where a different resistivity may represent a different logic state. For example, SBM architectures may use, as a memory element, a material having a variable resistance as a function of ion location in the material. The segregable material in an SBM memory cell may have different resistances within a single phase—e.g., may have a variable resistance while remaining within an amorphous or crystalline phase. In some cases, the memory cell 105 may include multiple segregable materials which may be programmable using different voltages or currents. In some examples, the different materials may be programmed into different combinations of segregated states, allowing memory cells 105 to store more than one logic state. As discussed below, the logic state of a memory cell 105 may be set by applying a voltage or series of voltages to a memory cell in a segregation-based architecture. In some examples, segregation-based architectures may use chalcogenide materials as memory elements. In some examples, a material may be capable of being included in either a PCM or an SBM architecture. That is, a resistance of such a material may be programmable by changing a phase of the material and/or a location of ions within the material.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be substantially perpendicular to one another to create an array. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, or other conductive materials, alloys, or compounds. Upon selecting a memory cell 105, the resulting signal may be used to determine the stored logic state. For example, a voltage may be applied and the resulting current may be used to differentiate between the resistive states of the phase change material.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—e.g., a logic value may be stored in the memory cell 105. Column decoder 130 or row decoder 120 may accept data, for example input 135, to be written to the memory cells 105. In the case of PCM, a memory cell 105 is written by heating the memory element, for example, by passing a current through the memory element. This process is discussed in more detail below. In the case of SBM, a memory cell 105 is written by passing a current through the memory element while refraining from heating the memory element to a glass-transition temperature. In some cases, SBM may include memory cells 105 having multiple storage elements which may be individually programmed by applying voltages (or currents) of different magnitudes and/or durations to a memory cell, yielding different combinations of resistivity across storage elements and thus different collective resistivities of the memory cell.

In some memory architectures, accessing the memory cell 105 may degrade or destroy the stored logic state and re-write or refresh operations may be performed to return the original logic state to memory cell 105. In DRAM, for example, a logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and SBM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed herein, non-volatile PCM and SBM cells may have beneficial properties. For example, PCM and SBM may offer comparable read/write speeds as DRAM but may be non-volatile and allow for increased cell density.

The memory controller 140 may control the operation (read, write, re-write, refresh, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, the memory controller 140 may select memory cell 105 for a write operation, where the memory cell includes a first material in a first phase (e.g., an amorphous phase) having a first resistivity that corresponds to a first logic value stored by the first material. The memory controller 140 may also apply a first voltage to memory cell 105 during the write operation. In some cases, the first material may remain in the first phase and have a second resistivity that corresponds to a second logic value stored by the first material after the first voltage is applied.

In some examples, the memory controller 140 may select memory cell 105 for a write operation, where the memory cell may include a first material having a first resistivity and a second material having a second resistivity. The memory controller 140 may apply a first voltage to memory cell 105 during the write operation, where the first material has a third resistivity and the second material has a fourth resistivity after the first voltage is applied. The memory controller 140 may also apply a second voltage to memory cell 105 during the write operation, where the first material has the first resistivity and the second material having the fourth resistivity after the second voltage is applied. In some cases, the first material may remain in the first phase (e.g., an amorphous phase) before and after the first and second voltages are applied and the second material may remain in the second phase (e.g., a crystalline phase or an amorphous phase) before and after the first and second voltages are applied.

Figure 2A:
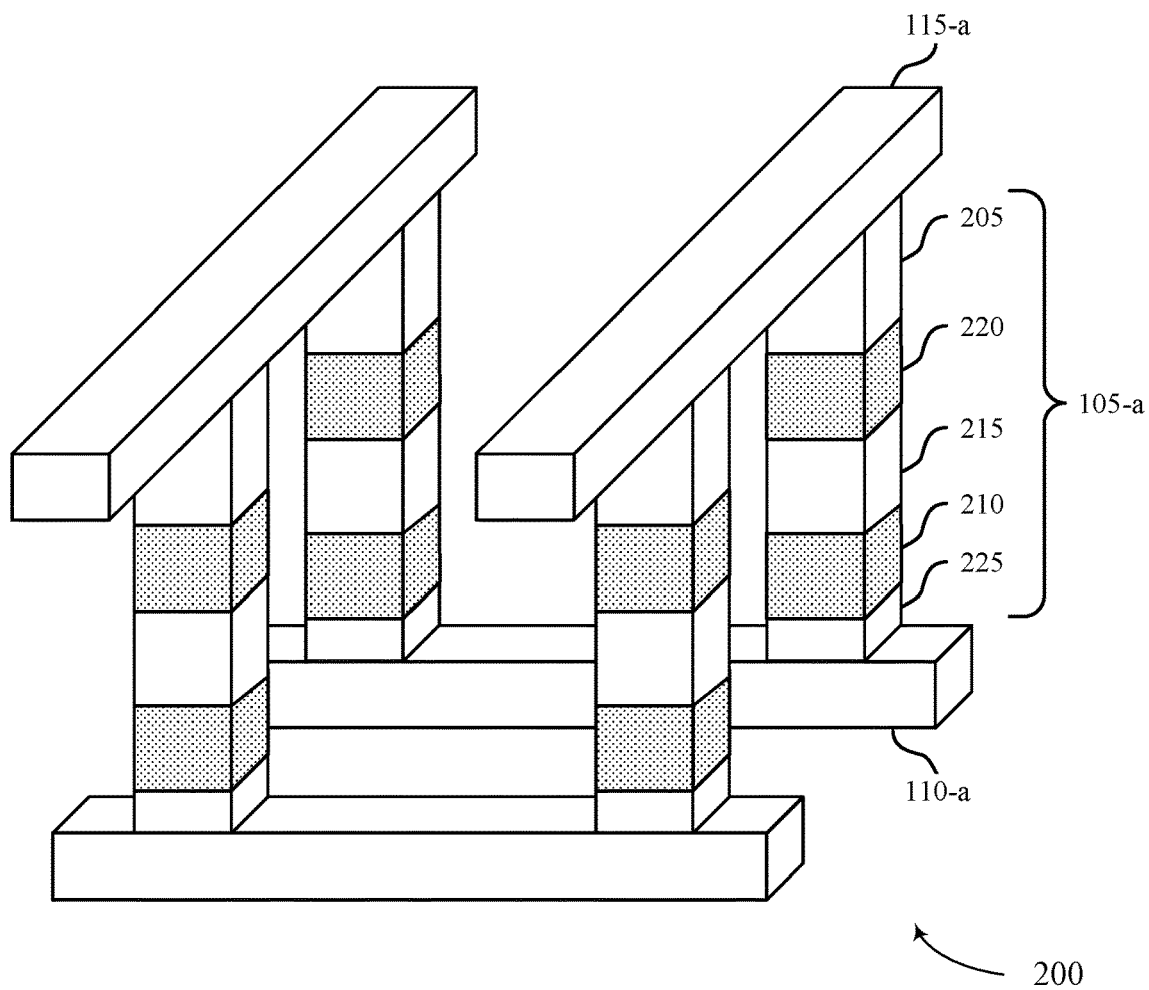
FIG. 2A illustrates an example of a memory array that supports SBM in accordance with various aspects of the present disclosure.

FIG. 2A illustrates an example of a memory array that supports SBM in accordance with various aspects of the present disclosure. Memory array 200 may be an example of a memory array or a representative portion thereof, and may include memory cell 105-a, word line 110-a, and bit line 115-a, which may be examples of a memory cell 105, word line 110, and bit line, as discussed with reference to FIG. 1.

Figure 2A:
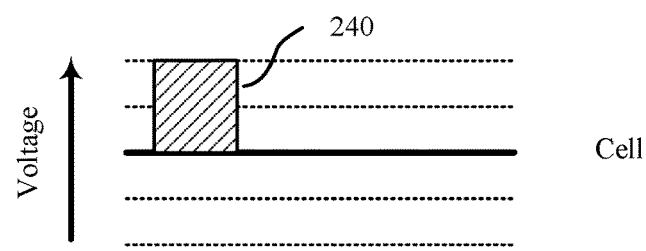

The structure of memory array 200 may be referred to as a cross-point architecture. It may also be referred to as a pillar structure. For example, as shown in FIG. 2, a pillar may be in contact with a first conductive line (word line 110-a) and a second conductive line (bit line 115-a). Such a pillar architecture may offer high-density data storage with low production costs. For example, the cross-point architecture may have memory cells with a reduced area and, resultantly, an increased memory cell density compared to at last some other architectures. In some examples, the architecture may have a $4F^2$ memory cell area, where F is the smallest feature size, compared to other architectures with a $6F^2$ memory cell area, such as those with a three-terminal selection.

Memory array 200 may be made by various combinations of material formation and removal. For example, layers of material may be deposited or otherwise formed that correspond to word line 110-a, bottom electrode 225, second memory element 220, middle electrode 215, first memory element 210, and top electrode 205. Material may be selectively removed to then create the desired features, such as the pillar structure depicted in FIG. 2. For example, features may be defined using photolithography to pattern a photoresist and then material may be removed by techniques such as etching. Bit lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

In some cases, a 3D memory array may be formed by stacking multiple memory arrays 200 on one another. The two stacked memory arrays may, in some examples, have common conductive lines such that each level may share word lines 110 or bit lines 115 as described with reference to FIG. 1.

Memory cell 105-a includes top electrode 205, first memory element 210, middle electrode 215, second memory element 220, which may be a chalcogenide material, and bottom electrode 225. Memory cell 105-a may be a target memory cell—e.g. a memory cell that has been selected for a memory operation (e.g., a read operation or a write operation).

Second memory element 220 of memory cell 105-a may include a material with a variable resistance. Variable resistance materials may refer to various material systems, including, for example, metal oxides, chalcogenides, and the like. In some examples, second memory element 220 is composed of a chalcogenide material comprising indium (In)—Sb—Te (IST) or In—Ge—Te (IGT). IST and IGT may have wide bandgaps and high glass transition temperatures (e.g., between 400 Kelvin (K) and 450 K) relative to a material included in first memory element 210.

In some examples, second memory element 220 may be programmable by changing a phase of the material (e.g., from an amorphous phase to a crystalline phase). Changing the phase of second memory element 220 may exploit a large resistance contrast between crystalline and amorphous phases of a material included in second memory element 220. Second memory element 220 may be changed from a first phase (e.g., amorphous) to another phase (e.g., crystalline) by heating second memory element 220 to at least a glass transition temperature of a material therein. Second memory element 220 may be changed back to the first phase (e.g., amorphous) by heating second memory element 220 to the melting temperature and by then quickly cooling second memory element 220.

In some cases, the period of time during which second memory element 220 transitions from the amorphous to the crystalline phase is referred to as the SET period and the period of time during which second memory element 220 transitions from the crystalline to the amorphous is referred to as the RESET period. For materials having wide bandgaps (e.g., IST or IGT), the duration of a corresponding SET period (e.g., ~100 μs) may exceed a maximum allowed duration for a memory operation. Thus, materials having wide bandgaps may not be used in PCM despite providing larger memory windows.

In some examples, second memory element 220 may additionally or alternatively be programmable using ion segregation. Such segregable materials exploit the large resistance contrast between a first and second state of ions within segregable materials, which may be metal oxides, chalcogenides, and the like. In some cases, the first and second state of ions within a material may be referred to as segregated or migrated states of the material. A material in a first segregated state may have a majority of ions located near one end of the material, which may result in a high electrical resistance and/or threshold voltage of the material. A material in a second segregated state may have a majority of ions located near another end of the material, which may result in a low electrical resistance and/or threshold voltage of the material.

In some examples, a first resistivity of second memory element 220 may correspond to a first segregated state of ions within second memory element 220 and a second resistivity of second memory element 220 may correspond to a second segregated state of ions within second memory element 220. In some examples, a resistivity of second memory element 220 corresponds to (e.g., depends at least in part on) a threshold voltage of second memory element 220. In some cases, a thickness of second memory element 220 when configured to be programmed using ion segregation may be reduced relative to a thickness of second memory element 220 when configured to be programmed using phase change techniques. For example, the thickness of second memory element 220 may be reduced by up to 50% when configured to be operated using ion segregation.

To set a low-resistivity state, a voltage or current having a first polarity (e.g., negative, which may refer to having the voltage of the bit line 115-a lower than the voltage of the word line 110-a) may be applied to memory cell 105-a. Applying the voltage of the first polarity may cause the ions within second memory element 220 to move to one end of second memory element 220. To set a high-resistivity state, a voltage or current having a second polarity (e.g., positive, which may refer to having the voltage of the bit line 115-a higher than the voltage of the word line 110-a) may be applied to memory cell 105-a. Applying the voltage of the second polarity may cause the ions within second memory element 220 to move to another end of second memory element 220. In some cases, the period of time during which second memory element 220 transitions from a first segregated state to a second segregated state is referred to as the segregation period. For certain materials (e.g., IST or IGT), a duration of the segregation period may be shorter than a duration of a SET period (e.g., ~100 μs). Regardless of polarity, a magnitude and duration of the voltage may be configured to cause ion movement within second memory element 220 while avoiding heating second memory element 220 to a melting temperature and within a minimum period of time (e.g., a minimum read duration for a memory operation).

Although a negative polarity is generally described as being when a voltage of bit line 115-a is lower than a voltage of word line 110-a and a positive polarity as being when a voltage of bit line 115-a is higher than a voltage of word line 110-a, these designations are merely labels and may be swapped without change of operation so long as the magnitude and polarity of the above voltages are maintained.

First memory element 210 of memory cell 105-a may also include a material with a variable resistance. In some cases, first memory element 210 may be connected in series between second memory element 220 and a conductive line, for example, between memory cell 105-a and at least one of word line 110-a or bit line 115-a. For example, first memory element 210 may be located between bottom electrode 225 and middle electrode 215; thus, first memory element 210 may be located in series between second memory element 220 and word line 110-a. Other configurations are possible. For example, first memory element 210 may be located in series between second memory element 220 and bit line 115-a (e.g., the positions of first memory element 210 and second memory element 220 may be swapped).

First memory element 210 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select devices, such as a diode. In some cases, first memory element 210 is a chalcogenide film such as, for example, an alloy comprising Se, arsenic (As), and Ge (SAG). In some cases, first memory element 210 has a narrow bandgap and a low glass transition temperature (e.g., between 350 K and 400 K) relative to second memory element 220. In some examples, a thickness of first memory element 210 is around 20 nm.

In some cases, first memory element 210 may be programmed using ion segregation, individually or in combination with second memory element 220, as discussed with reference to second memory element 220. In some examples, a first resistivity of first memory element 210 may correspond to a first segregated state of ions within first memory element 210 and a second resistivity of first memory element 210 may correspond to a second segregated state of ions within first memory element 210. In some examples, a resistivity of first memory element 210 corresponds to a threshold voltage of first memory element 210.

In some examples, first memory element 210 may be used to store a first bit of a logic value (e.g., the least significant bit (LSB)) and second memory element 220 may be used to store a second bit of the logic value (e.g., the most significant bit (MSB)). In some examples, ions in first memory element 210 respond to different voltages and/or currents (e.g., voltages and/or currents with different magnitudes) than ions in second memory element 220. For example, a first current having a first duration may cause ion movement in first memory element 210 but not in second memory element 220. And a second current having a second duration (e.g., larger in magnitude than the first current) may cause ion movement in both first memory element 210 and second memory element 220. In some cases, the first and second duration may be the same.

That is, a resistivity of first memory element 210 may be programmable within an initial phase (e.g., while remaining in an amorphous phase) using an amount of current that is larger than a first threshold and a resistivity of second memory element 220 may be programmable within an initial phase (e.g., while remaining in an amorphous or crystalline phase) using an amount of current that is larger than a second threshold, where the first threshold may be lower than the second threshold. In some examples, a resistivity of both first memory element 210 and second memory element 220 is programmable with an amount of current that is below a third threshold, where the third threshold is based on an amount of current that causes either first memory element 210 or second memory element 220 to reach a glass transition temperature.

In some examples, a bandgap energy of first memory element 210 is lower than a bandgap energy of second memory element 220. In some cases, intermediate logic states (e.g., 01 and 10) stored by the combination of first memory element 210 and second memory element 220 may experience little to no amorphization drift relative to phase change programming of first memory element 210 and second memory element 220 because the initial phase of first memory element 210 and second memory element 220 remain the same throughout the programming process.

In some cases, first memory element 210 may alternatively or additionally be used as a selection component. First memory element 210 may aid in selecting a particular memory cell 105-a or may help prevent stray currents from flowing through non-selected memory cells 105-a adjacent a selected memory cell 105-a. It may also reduce the bias across untargeted memory cells. For example, first memory element 210 may have a threshold voltage such that a current flows through first memory element 210 when the threshold voltage is met or exceeded.

For SBM architectures, one technique for sensing the logic state stored at second memory element 220 includes passing a current through memory cell 105-a and measuring a resulting voltage. Another technique for sensing the logic state stored at second memory element 220 may be to apply an increasing voltage across memory cell 105-a and to measure the resulting current.

Voltage plot 201 depicts voltages applied as a function of time during an example access operation of a target memory cell, such as memory cell 105-a, that includes applying an aggregate voltage across the target memory cell by applying opposite polarity voltages to both access lines. Prior to accessing memory cell 105-a, both the word line 110-a and bit line 115-a may be maintained at a first voltage (e.g., is virtual ground). In some examples, to access memory cell 105-a, a voltage may be applied to bit line 115-a while word line 110-a is maintained at a virtual ground.

Accordingly, cell access voltage 240 may be applied across memory cell 105-a, where cell access voltage 240 may be equal to the voltage applied to bit line 115-a—e.g., when bit line 115-a is designated as the positive terminal. In some cases, memory cell 105-a may be accessed by simultaneously applying a first voltage having a first polarity to word line 110-a and a second voltage having a second polarity to bit line 115-a, where the voltages applied to the word line 110-a and bit line 115-a are additive across the memory cell 105-a, and the resulting voltage applied to target memory cell 105-a is cell access voltage 240.

Figure 2B:
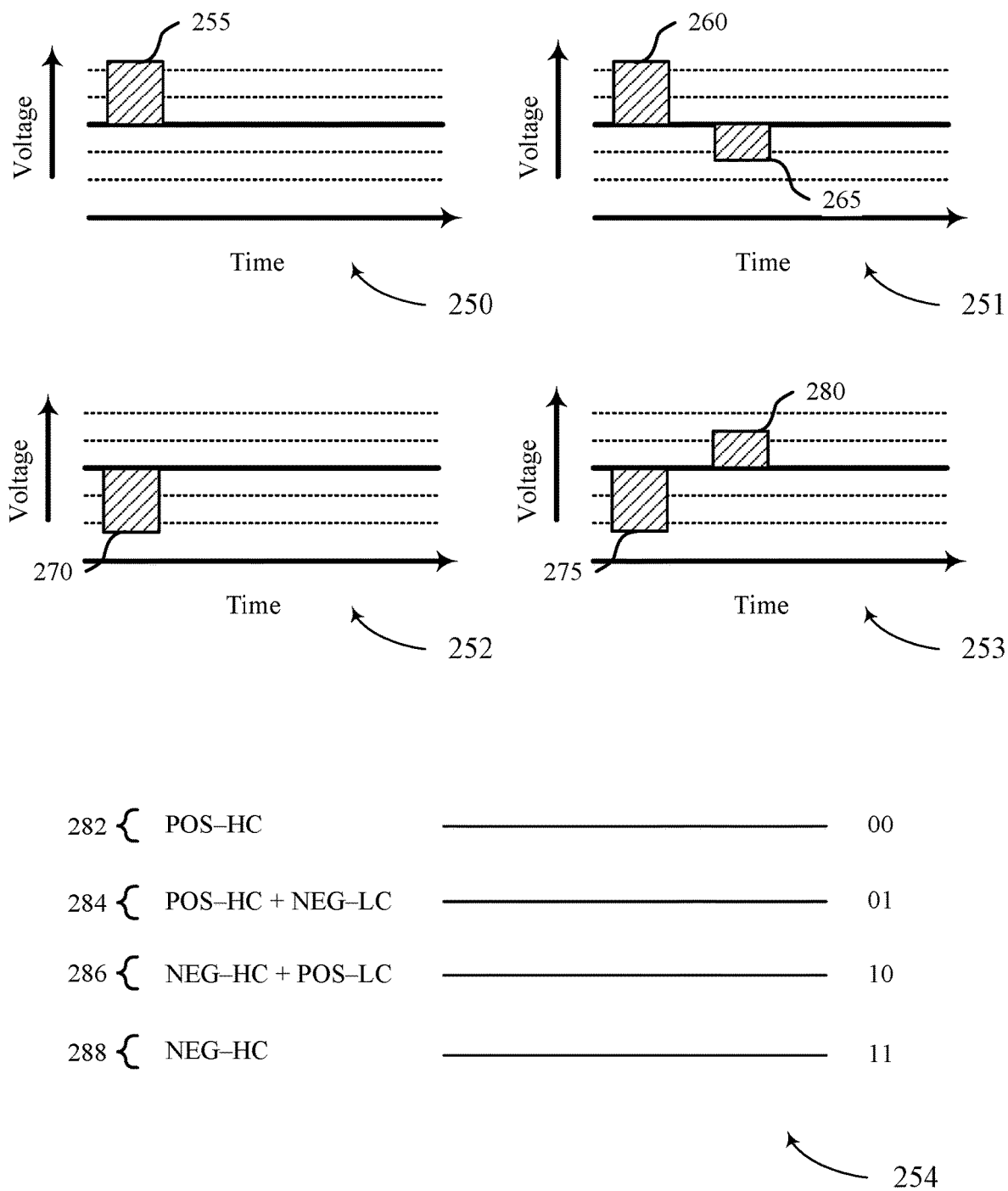
FIG. 2B illustrates exemplary diagrams for the operation of SBM in accordance with various aspects of the present disclosure.

FIG. 2B illustrates exemplary diagrams for the operation of SBM in accordance with various aspects of the present disclosure. The exemplary diagrams include first voltage plot 250, second voltage plot 251, third voltage plot 252, and fourth voltage plot 253, which may depict aspects of a memory operation performed to access a memory cell, such as memory cell 105-a, as discussed with reference to FIG. 2A. The exemplary diagrams also include a table 254 mapping voltage sequences to non-binary logic values.

Each of first voltage plot 250, second voltage plot 251, third voltage plot 252, and fourth voltage plot 253 include a voltage axis and a time axis and may depict the application of one or more voltages across a memory cell during a write operation.

First voltage plot 250 depicts aspects of a write operation for a first logic state (e.g., "00"). In some examples, a memory device selects a memory cell, such as memory cell 105-a, for a write operation. As discussed above, memory cell 105-a may include first memory element 210 having a first resistivity and being in a first phase (e.g., an amorphous phase) and second memory element 220 having a second resistivity and being in a second phase (e.g., an amorphous or crystalline phase), where the first and second phase may be the same or different.

After selecting memory cell 105-a, the memory device may (e.g., via a biasing component) apply first voltage 255 across memory cell 105-a. First voltage 255 may be a positive voltage and may be classified as a high voltage/current pulse (relative to other voltages such as third voltage 265 and sixth voltage 280). In some examples, the positive voltage may be applied across memory cell 105-a by applying first voltage 255 to bit line 115-a while word line 110-a is maintained at a virtual ground. In some cases, the magnitude and duration of first voltage 255 is configured to avoid heating either first memory element 210 or second memory element 220 to a respective melting temperature. In some examples, the magnitude and duration of first voltage 255 is configured to induce movement of ions in first memory element 210 and second memory element 220 within a minimum timing of a memory operation.

In response to the application of first voltage 255, ions within first memory element 210 may move toward a top of first memory element 210 and ions within second memory element 220 may move toward a top of second memory element 220. When the ions are located near a top of first memory element 210, a resistivity (e.g., resistance or voltage threshold) of first memory element 210 may be higher than when the ions are located near the bottom of first memory element 210. Similarly, when the ions are located near a top of second memory element 220, a resistivity of second memory element 220 may be higher than when the ions are located near the bottom of second memory element 220.

Accordingly, memory cell 105-a may be in a high resistivity state after the application of first voltage 255 based on the combination of first memory element 210 being in a high resistivity state and second memory element 220 being in a high resistivity states. Also, first memory element 210 may remain in the first phase and second memory element 220 may remain in the second phase during and after first voltage 255 is applied based on the magnitude and duration of first voltage 255 not heating either of first memory element 210 or second memory element 220 to a respective melting temperature.

The logic value stored by memory cell 105-a (e.g., "00") may be determined based on the high resistivity state of memory cell 105-a. For example, the high resistivity state may correspond to non-binary logic value 00. In some cases, second memory element 220 may be used to store a first bit of the non-binary logic value (e.g., the MSB of the logic value) and first memory element 210 may be used to store a second bit of the non-binary logic value (e.g., the LSB of the logic value). That is, second memory element 220 may store a logic 0 based on being in a higher resistivity state and first memory element 210 may store a logic 0 based on being in a higher resistivity state. And together second memory element 220 and first memory element 210 may store logic value 00. This way, first voltage sequence 282 may program a logic value 00 into memory cell 105-*a* by applying a positive, high intensity electric pulse to memory cell 105-*a*, as depicted by table 254.

Second voltage plot 251 depicts aspects of a write operation for a second logic state (e.g., "01"). In some examples, a memory device selects a memory cell, such as memory cell 105-*a*, for a write operation. After selecting memory cell 105-*a*, the memory device may (e.g., via a biasing component) apply second voltage 260 across memory cell 105-*a*. Second voltage 260 may have a positive polarity and may be classified as a high current pulse (relative to other voltages such as third voltage 265 and sixth voltage 280). As discussed above, in response to the application of second voltage 260, ions within first memory element 210 and second memory element 220 may move toward a top of first memory element 210 and second memory element 220, and memory cell 105-*a* may be in a high resistivity state after second voltage 260 is applied.

The memory device may then apply third voltage 265 across memory cell 105-*a*. Third voltage 265 may have a negative polarity and may be classified as a low current pulse (relative to other voltages such as first voltage 255, second voltage 260, fourth voltage 270, or fifth voltage 275). In some cases, the magnitude and duration of third voltage 265 is configured to induce movement of the ions within first memory element 210 but not the ions within second memory element 220. In some cases, the magnitude and duration of third voltage 265 is configured to induce movement of the ions within first memory element 210 within a certain time constraint. In some cases, the duration of third voltage 265 is shorter than the duration of second voltage 260.

In response to the application of third voltage 265, ions within first memory element 210 (which may be a narrow bandgap/low glass transition temperature material relative to second memory element 220) may move toward a bottom of first memory element 210 while ions within second memory element 220 (which may be a wide bandgap/high glass transition temperature material relative to first memory element 210) may remain at the top of second memory element 220. In some cases, the magnitude of third voltage 265 is configured so that ions in first memory element 210 will move within first memory element 210, while ions in second memory element 220 will remain in their current location. As discussed above, when the ions are located near a bottom of first memory element 210, a resistivity of first memory element 210 may be lower than when the ions are located near the top of first memory element 210.

Also, when the ions of second memory element 220 are near the top of second memory element 220, memory element may have a higher resistance than when the ions are near the bottom of second memory element 220. Accordingly, memory cell 105-*a* may be in a first intermediary resistivity state after the application of third voltage 265 based on the combination of first memory element 210 being in a lower resistivity state and second memory element 220 being in a higher resistivity state. Also, first memory element 210 may remain in the first phase and second memory element 220 may remain in the second phase during and after second voltage 260 and third voltage 265 are applied based on the magnitude and duration of second voltage 260 and third voltage 265 not heating either of first memory element 210 or second memory element 220 to a respective melting temperature.

The logic value stored by memory cell 105-*a* (e.g., "01") may be determined based on the first intermediary resistivity state of memory cell 105-*a*. For example, the first intermediary resistivity state may correspond to non-binary logic value 01. As discussed above, second memory element 220 may be used to store an MSB of the non-binary logic value and first memory element 210 may be used to store an LSB of the non-binary logic value. That is, second memory element 220 may store a logic 0 based on being in a higher resistivity state and first memory element 210 may store a logic 1 based on being in a lower resistivity state. And together second memory element 220 and first memory element 210 may store logic value 01. This way, second voltage sequence 284 may program a logic value 01 into memory cell 105-*a* by applying a positive, high intensity electric pulse to memory cell 105-*a* followed by a negative, low intensity electric pulse, as depicted by table 254.

Third voltage plot 252 depicts aspects of a write operation for a third logic state (e.g., "11"). In some examples, a memory device selects a memory cell, such as memory cell 105-*a*, for a write operation. After selecting memory cell 105-*a*, the memory device may (e.g., via a biasing component) apply fourth voltage 270 across memory cell 105-*a*. Fourth voltage 270 may have a negative polarity and may be classified as a high current pulse (relative to other voltages such as third voltage 265 and sixth voltage 280). In some examples, fourth voltage 270 may be applied to word line 110-*a* while bit line 115-*a* may be maintained at a virtual ground. In some cases, the magnitude and duration of fourth voltage 270 is configured to avoid heating either first memory element 210 or second memory element 220 to a respective melting temperature. In some examples, the magnitude and duration of first voltage 255 is configured to induce movement of ions in first memory element 210 and second memory element 220 within a minimum timing of a memory operation.

In response to the application of fourth voltage 270, ions within first memory element 210 may move toward a bottom of first memory element 210 and ions within second memory element 220 may move toward a bottom of second memory element 220. As discussed above, first memory element 210 and second memory element 220 may have a lower resistivity when the ions are near a bottom of the respective memory elements. Accordingly, after applying fourth voltage 270, memory cell 105-*a* may be in a low resistivity state. Also, first memory element 210 may remain in the first phase and second memory element 220 may remain in the second phase during and after fourth voltage 270 is applied based on the magnitude and duration of fourth voltage 270 not heating either of first memory element 210 or second memory element 220 to a respective melting temperature.

The logic value stored by memory cell 105-*a* (e.g., "11") may be determined based on the low resistivity state of memory cell 105-*a*. For example, the low resistivity state may correspond to non-binary logic value 11. As discussed above, second memory element 220 may be used to store an MSB of the non-binary logic value and first memory element 210 may be used to store an LSB of the non-binary logic value. That is, second memory element 220 may store a logic 1 based on being in a lower resistivity state and first memory element 210 may store a logic 1 based on being in a lower resistivity state. And together second memory element 220 and first memory element 210 may store logic value 11. This way, fourth voltage sequence 288 may program a logic value 11 into memory cell 105-*a* by applying a negative, high intensity electric pulse to memory cell 105-*a*, as depicted by table 254.

Fourth voltage plot 253 depicts aspects of a write operation for a fourth logic state (e.g., "10"). In some examples, a memory device selects a memory cell, such as memory cell 105-*a*, for a write operation. After selecting memory cell 105-*a*, the memory device may (e.g., via a biasing component) apply fifth voltage 275 across memory cell 105-*a*. Fifth voltage 275 may have a negative polarity and may be classified as a high current pulse (relative to other voltages such as third voltage 265 and sixth voltage 280). As discussed above, in response to the application of fifth voltage 275, ions within first memory element 210 and second memory element 220 may move toward a bottom of the respective memory elements, and memory cell 105-*a* may be in a low resistivity state after fifth voltage 275 is applied.

The memory device may then apply sixth voltage 280 across memory cell 105-*a*. Sixth voltage 280 may have a positive polarity and may be classified as a low current pulse (relative to other voltages such as first voltage 255, second voltage 260, fourth voltage 270, or fifth voltage 275). In some cases, the magnitude and duration of sixth voltage 280 is configured to induce movement of the ions within first memory element 210 but not the ions within second memory element 220. In some cases, the magnitude and duration of sixth voltage 280 is configured to induce movement of the ions within first memory element 210 within a certain time constraint. In some cases, the duration of sixth voltage 280 is shorter than the duration of fifth voltage 275.

In response to the application of sixth voltage 280, ions within first memory element 210 (which may be a narrow bandgap/low glass transition temperature material) may move toward a top of first memory element 210 while ions within second memory element 220 may remain at the bottom of second memory element 220. In some cases, the magnitude of sixth voltage 280 is configured so that ions in first memory element 210 will move within first memory element 210, while ions in second memory element 220 will remain in their current location. As discussed above, when the ions are located near a top of first memory element 210, a resistivity of first memory element 210 may be higher than when the ions are located near the bottom of first memory element 210. Also, when the ions of second memory element 220 are near the bottom of second memory element 220, second memory element 220 may have a lower resistance than when the ions are near the top of second memory element 220. Accordingly, memory cell 105-*a* may be in a second intermediary resistivity state after the application of sixth voltage 280 based on the combination of first memory element 210 being in a higher resistivity state and second memory element 220 being in a lower resistivity state. Also, first memory element 210 may remain in the first phase and second memory element 220 may remain in the second phase during and after fifth voltage 275 and third sixth 280 are applied based on the magnitude and duration of fifth voltage 275 and sixth voltage 280 not heating either of first memory element 210 or second memory element 220 to a respective melting temperature.

The logic value stored by memory cell 105-*a* (e.g. "10") may be determined based on the second intermediary resistivity state of memory cell 105-*a*. For example, the second intermediary resistivity state may correspond to non-binary logic value 10. The second intermediary resistivity state may be distinct from the first intermediary resistivity state. As discussed above, second memory element 220 may be used to store an MSB of the non-binary logic value and first memory element 210 may be used to store an LSB of the non-binary logic value. That is, second memory element 220 may store a logic 1 based on being in a higher resistivity state and first memory element 210 may store a logic 0 based on being in a lower resistivity state. And together second memory element 220 and first memory element 210 may store logic value 10. This way, third voltage sequence 286 may program a logic value 10 into memory cell 105-*a* by applying a negative, high intensity electric pulse to memory cell 105-*a* followed by a positive, low intensity electric pulse, as depicted by table 254.

This way, memory cell 105-*a* may be programmable to have any of four distinct resistivity states, each of which may correspond to a particular logic value (e.g., a non-binary logic value).

Although the above examples provide that the ions within a material move from one end of memory element to another in response to a voltage being applied, in some cases, the ions within a material stay at one end of the memory element in response to a voltage being applied—e.g., the ions within a memory element may remain at a bottom of the memory element in response to a negative voltage being applied across the memory element.

In some examples, a logic state stored at a memory cell, such as memory cell 105-*a*, may be read by applying a voltage with a negative polarity across the memory cell—e.g., by applying a higher voltage to word line 110-*a* than to bit line 115-*a*. Reading the memory cell by applying a negative voltage may enlarge the memory window. Reading the memory cell may include applying a predetermined or increasingly negative voltage across memory cell 105-*a* and observing the resulting current through memory cell 105-*a*—e.g., a first observed current may be associated with a first logic value, a second observed current may be associated with a second logic value, a third observed current may be associated with a third logic value, and so on. For example, if a low current is observed, it may be determined that memory cell 105-*a* is in a low resistivity state and is storing a corresponding logic value (e.g., "11").

Although the above generally discusses writing non-binary logic states to a memory cell including two memory elements, similar operations may be applied to write non-binary logic states to a memory cell including more than two memory elements in any number. For example, for a memory cell with three segregable memory elements, three different voltages may be used where a first voltage induces ion movement in all three memory elements, a second voltage induces ion movement in two memory elements, and other voltages induce ion movement in some subset of memory elements.

Figure 3:
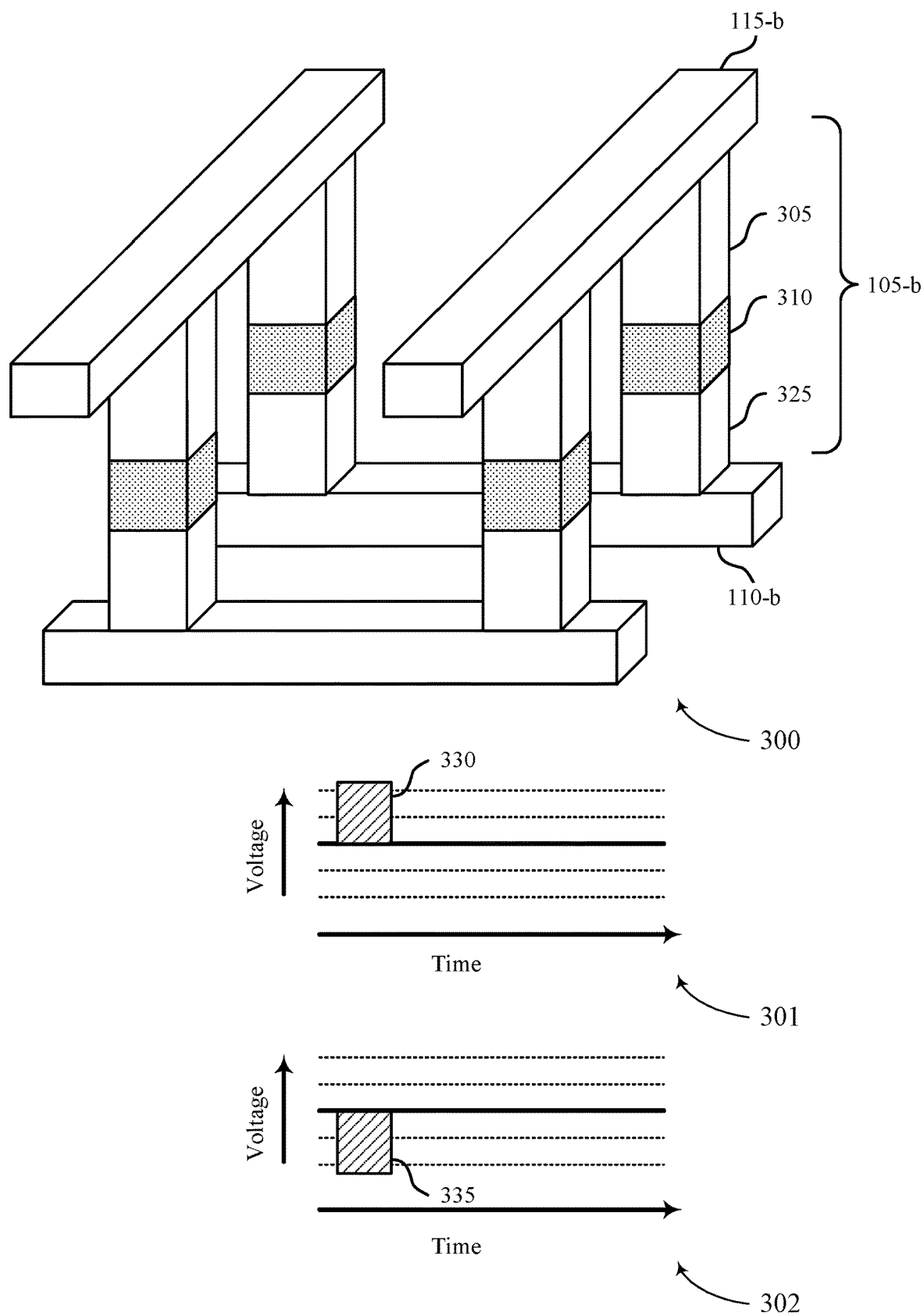
FIG. 3 illustrates an example of a memory array that supports SBM and exemplary voltage plots for the operation of SBM in accordance with various aspects of the present disclosure.

FIG. 3 illustrates an example of a memory array that supports SBM and exemplary voltage plots for the operation of SBM in accordance with various aspects of the present disclosure. Memory array 300 may be an example of a memory array 200 as described with reference to FIGS. 1 and 2A. Memory array 300 may include memory cell 105-*b*, word line 110-*b*, and bit line 115-*b*, which may be examples of a memory cell 105, word line 110, and bit line 115, as described with reference to FIGS. 1 and 2.

Memory cell 105-*b* may include top electrode 305, memory element 310, and bottom electrode 325. Memory element 310 may be an example of first memory element 210, as discuss with reference to FIG. 2. In some examples, memory element 310 performs the functions of both a selection component (e.g., prevent stray and leakage currents from flowing through memory cell 105-*b*) and a storage component (e.g., storing a logic value). Memory cell 105-*b* may be referred to as a self-selecting memory cell. In some examples, memory element 310 includes a segregable material. In some examples, memory element 310 includes a material having a narrow bandgap and a low glass transition temperature (e.g., SAG). In some examples, the material is in an amorphous phase. In some examples, a segregation period for memory element 310 is shorter than a SET period for memory element 310.

Memory cell 105-b may store data in memory element 310 using segregation-based techniques. In some examples, first voltage plot 301 and second voltage plot 302 depict the application of a voltage to memory cell 105-b during an exemplary segregation-based access operation. In some cases, the voltage applied across memory cell 105-b is generated using both word line 110-b and bit line 115-b, as discussed with reference to FIG. 2A.

First voltage plot 301 depicts aspects of a write operation for memory cell 105-b. In some examples, a memory device selects a memory cell, such as memory cell 105-b, for a write operation. As discussed above, memory cell 105-b includes memory element 310 having a first resistivity corresponding to a first logic value (e.g., logic value 1) and being in a first phase (e.g., an amorphous phase). After selecting memory cell 105-b, the memory device may apply first voltage 330 across memory cell 105-b. First voltage 330 may be a positive voltage and may cause the ions within memory element 310 to move to the top of memory element 310. Accordingly, a resistivity (e.g., a threshold voltage or resistance) of memory element 310 may increase to a first value. First voltage 330 may then be removed from memory cell 105-b, and memory element 310 may maintain the increased resistivity. In some cases, the increased resistivity of memory element 310 corresponds to a second logic state (e.g., logic value 0). During and after the application of first voltage 330, memory element 310 may remain in the amorphous phase.

In some examples, a magnitude and duration of first voltage 330 is configured so that the application of first voltage 330 will not heat memory element 310 to its melting temperature. In some examples, a magnitude and duration of first voltage 330 is configured so that ions within memory element 310 move from one end of memory element 310 to another—e.g., the duration and magnitude may be configured so that a majority of the ions within memory element 310 move to one end of memory element 310 within a certain period of time. In some cases, relatively short voltage pulses with relatively low magnitudes may be applied to memory element 310.

Second voltage plot 302 depicts aspects of a write operation for memory cell 105-b. In some examples, a memory device selects a memory cell, such as memory cell 105-b, for a write operation. After selecting memory cell 105-b, second voltage 335 may be applied across memory cell 105-b. Second voltage 335 may be a negative voltage and may cause the ions within memory element 310 to move to the bottom of memory element 310. Accordingly, a resistivity of memory element 310 may decrease to a second value. After second voltage 335 is removed from memory cell 105-b, memory element 310 may maintain the decreased resistivity. In some cases, the decreased resistivity of memory element 310 corresponds to a second logic state (e.g., logic value 1). A magnitude and duration of second voltage 335 may be similarly configured as the magnitude and duration for first voltage 330. This way, a resistivity of memory element 310 may be changed within a single material state by applying voltages of varying polarities.

Although the above examples provide that the ions within a material move from one end of memory element to another in response to a voltage being applied, in some cases, the ions within a material stay at one end of the memory element in response to a voltage being applied—e.g., the ions within a memory element may remain at a bottom of the memory element in response to a negative voltage being applied across the memory element.

Figure 4:
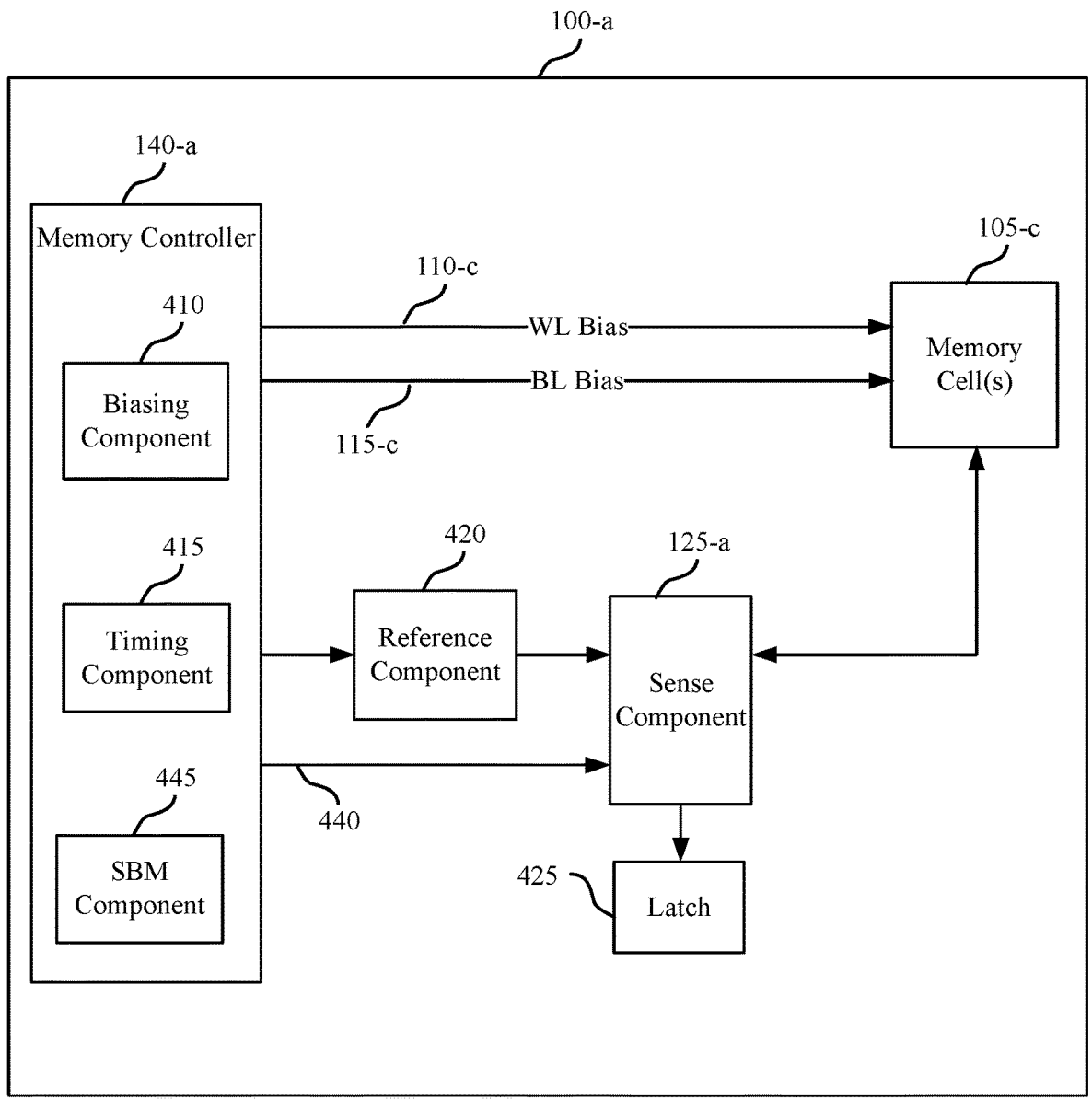
FIG. 4 illustrates a block diagram of a memory array that supports the operation of SBM in accordance with various embodiments of the present disclosure.

FIG. 4 illustrates a block diagram 400 of a memory array 100-a that supports the operation of SBM in accordance with various embodiments of the present disclosure. Memory array 100-a may be referred to as an electronic memory apparatus and includes memory controller 140-a and memory cell 105-c, which may be examples of memory controller 140 and memory cell 105 described with reference to FIGS. 1 to 3. Memory array 100-a may also include reference component 420 and latch 425. The components of memory array 100-a may be in electronic communication with each other and may perform the functions described with reference to FIGS. 1-3. In some cases, reference component 420, sense component 125-a and latch 425 may be components of memory controller 140-a.

Memory controller 140-a may, in combination with other components apply voltages throughout memory array 100-a, write data to memory cells 105-c, read data from memory cells 105-c, and generally operate memory array 100-a as described in FIGS. 1-3. Memory controller 140-a may include biasing component 410 and timing component 415. In some cases, memory controller may include SBM component 445. Memory controller 140-a may be in electronic communication with word line 110-c, bit line 115-c, and sense component 125-a, which may be examples of a word line 110, bit line 115, and sense component 125, as described with reference to FIG. 1 or 2.

Memory controller 140-a may be configured to activate word line 110-c or bit line 115-c by applying voltages to those various nodes. For example, biasing component 410 may be configured to apply a voltage to operate memory cell 105-c to read or write memory cell 105-c as described above. In some cases, memory controller 140-a may include a row decoder, column decoder, or both, as described with reference to FIG. 1. This may enable memory controller 140-a to access one or more memory cells 105. Biasing component 410 may also provide voltage potentials to reference component 420 in order to generate a reference signal for sense component 125-a. Additionally, biasing component 410 may provide voltage potentials for the operation of sense component 125-a.

In some cases, memory controller 140-a may perform its operations using timing component 415. For example, timing component 415 may control the timing of the various word line selections or plate biasing, including timing for switching and voltage application to perform the memory functions, such as reading and writing, discussed herein. In some cases, timing component 415 may control the operations of biasing component 410.

Reference component 420 may include various components to generate a reference signal for sense component 125-a. Reference component 420 may include circuitry configured to produce a reference signal.

Memory cell 105-c may include one or more memory elements that may be operated using ion segregation, as discussed with reference to FIGS. 1-3. In some cases, memory cell 105-c includes a first memory element having a wide bandgap and high glass transition temperature and a second memory element having a narrow bandgap and low glass transition temperature. In some examples, the first memory element may be in a first state (e.g., an amorphous phase) and the second memory element may be in a second state (e.g., a crystalline phase or an amorphous phase). In some cases, the first memory element and second memory element may experience ion segregation in response to different voltage—e.g., a certain voltage may cause ion segregation in one memory element but not another.

Sense component 125-a may compare a signal from memory cell 105-c (through bit line 115-c) with a reference signal from reference component 420. Upon determining the logic state, the sense component may then store the output in latch 425, where it may be used in accordance with the operations of an electronic device that memory array 100-a is a part.

SBM component 445 may provide information for operating a memory array using SBM. For instance, SBM component 445 may provide voltage and current information for operating memory cells 105-c. The information in SBM component 445 may be used by biasing component 410 and timing component 415 when applying voltages to memory cell 105-c. In some examples, SBM component 445 provides a magnitude and duration for applying the first and second voltages to memory cell 105-c. For examples, SBM component 445 may store a magnitude and duration for the first voltage that avoids heating the memory element(s) within memory cell 105-c to a melting temperature. SBM component 445 may also store a magnitude and duration for the second voltage that causes ion segregation in one memory element in memory cell 105-c but not another memory element.

In some examples, memory controller 140-a selects memory cell 105-c for a write operation, where memory cell 105-c includes a first material having a first resistivity (e.g., first memory element 210) and a second material having a second resistivity (e.g., second memory element 220). Memory controller may also cause biasing component 410 to apply a first voltage to memory cell 105-c during the write operation. In some cases, after the first voltage is applied, the first material may have a third resistivity and the second material may have a fourth resistivity. Memory controller may also cause biasing component 410 to apply a second voltage to memory cell 105-c during the write operation. After the second voltage is applied, the first material may have the first resistivity and the second material may have the fourth resistivity. In some cases, the first material is in a first phase (e.g., an amorphous phase) and the second material is in a second phase (e.g., an amorphous or crystalline phase) before, during, and after the application of the first voltage and second voltages.

Sense component 125-a may determine a logic value of the memory cell based at least in part on a resistivity of the first material and the second material—e.g., by passing a current through memory cell 105-c. In some cases, a combination of the resistivity of the first material and a resistivity of the second material correspond to a logic value. For instance, a first combination of the first resistivity (e.g., high) and the second resistivity (e.g., high) may corresponds to a first logic value (e.g., "00"), a second combination of the third resistivity (e.g., low) and the fourth resistivity (e.g., low) corresponds to a second logic value (e.g., "11"), and a third combination of the first resistivity (e.g., high) and the fourth resistivity (e.g., low) corresponds to a third logic value (e.g., "10"). And a fourth combination of the third resistivity (e.g., low) and the second resistivity (e.g., high) corresponds to a fourth logic value (e.g., "01").

In some cases, memory controller 140-a may identify a logic value to store at memory cell 105-c and may determine a polarity for the first voltage applied by biasing component 410 and the second voltage applied by biasing component 410 based on the logic value. For example, to write a logic "01," memory controller 140-a may determine that the first voltage will have a positive polarity and that the second voltage will have a negative polarity.

Memory controller 140-a may also identify a magnitude and duration for the first and second voltages. In some cases, the magnitude and duration for the first and second voltage is based on a glass transition temperature of the first material and a glass transition temperature of the second material—e.g., the magnitude and duration may be configured so that an internal temperature of neither the first material or the second material reaches a respective melting temperature during or after the application of the first and second voltages. In some cases, a magnitude of the first voltage is higher than a magnitude of the second voltage. In some cases, the first voltage has a first polarity and the second voltage has a second polarity.

In some examples, memory controller 140-a selects memory cell 105-c for a first write operation. Memory cell 105-c may include a first material (e.g., first memory element 210 or memory element 310) in a first phase (e.g., an amorphous phase) and having a first resistivity—e.g., where the first resistivity of the first material corresponds to a first logic value stored by the first material. Memory controller 140-a may cause biasing component 410 to apply a first voltage to memory cell 105-c during the write operation. In some cases, the first material may remain in the first phase during and after the application of the first voltage and may have a second resistivity that corresponds to a second logic value after the first voltage is applied.

In some cases, memory controller 140-a causes biasing component 410 to apply a second voltage to memory cell 105-c during a second write operation, where the first material may remain in the first phase during and after the application of the second voltage, but may have the first resistivity after the application of the second voltage. In some cases, the first resistivity is lower than the second resistivity. In some cases, the first voltage has a first polarity and the second voltage has a second polarity. In some cases, ions within the first material move toward an end of the first material in response to the first voltage being applied, and a value of the second resistivity is based on the ion movement—e.g., if the ions move to a top of the first material, the second resistivity may be higher than if the ions were located a bottom of the first material.

In some cases, memory cell 105-c includes a second material (e.g., second memory element 220) in a second phase (e.g., an amorphous or crystalline phase) and having a third resistivity that corresponds to a third logic value stored by the second material. In some cases, a combination of the second resistivity and the third resistivity corresponds to a non-binary logic value stored by the memory cell. The first voltage may be applied to both the first and second materials of memory cell 105-c. In some cases, the second material has a fourth resistivity after the first voltage is applied, but remains in the second phase during and after the application of the first voltage. In some cases, the second material in the second phase has the third resistivity after the first voltage is applied—e.g., if the ions within the second material are located at a particular end of the second material before the first voltage is applied. In some examples, the first material is programmable with a first current and the second material is programmable with a second current having a greater magnitude and/or shorter duration than the first current.

Memory controller 140-a may cause biasing component 410 to apply a second voltage to memory cell 105-c during the first write operation. After the second voltage being applied, the first material may remain in the first phase and have the first resistivity and the second material may remain in the second phase and have the fourth resistivity.

Figure 5:
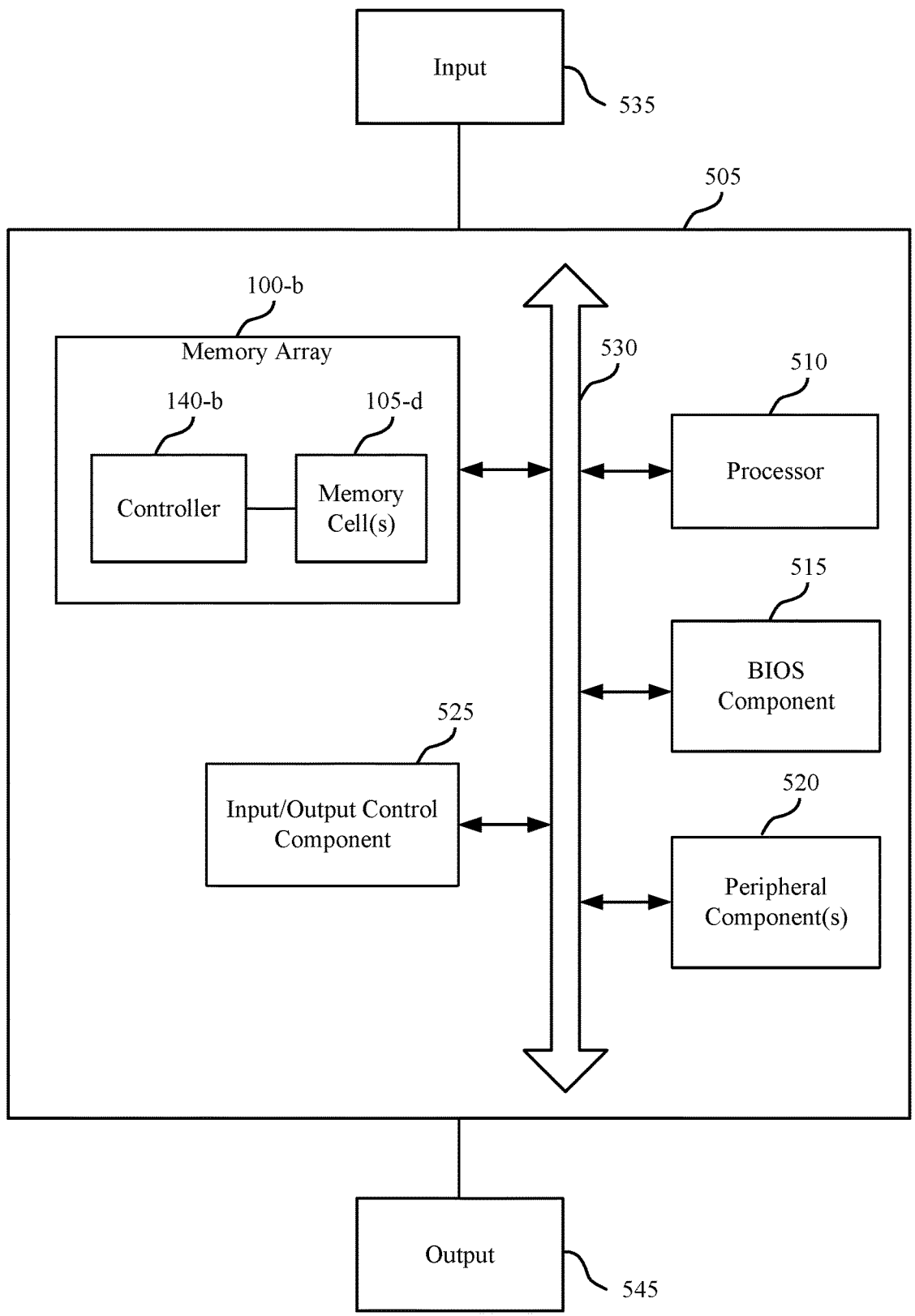
FIG. 5 illustrates a system, including a memory array, that supports the operation of SBM in accordance with various embodiments of the present disclosure.

FIG. 5 illustrates a system, including a memory array, that supports the operation of SBM in accordance with various embodiments of the present disclosure. System 500 may include a device 505, which may be or include a printed circuit board to connect or physically support various components. Device 505 includes a memory array 100-b, which may be an example of memory array 100 described with reference to FIGS. 1 and 4. Memory array 100-b may contain memory controller 140-b and memory cell(s) 105-d, which may be examples of memory controller 140 described with reference to FIGS. 1 and 4 and memory cells 105 described with reference to FIG. 1-4. Device 505 may also include a processor 510, basic input/output system (BIOS) component 515, peripheral component(s) 520, and input/output control component 525. The components of device 505 may be in electronic communication with one another through bus 530.

Processor 510 may be configured to operate memory array 100-b through memory controller 140-b. In some cases, processor 510 may perform the functions of memory controller 140 described with reference to FIGS. 1 and 4. In other cases, memory controller 140-b may be integrated into processor 510. Processor 510 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 510 may perform various functions described herein, including the operation of SBM. Processor 510 may, for example, be configured to execute computer-readable instructions stored in memory array 100-b to cause device 505 perform various functions or tasks.

BIOS component 515 may be a software component that includes a BIOS operated as firmware, which may initialize and run various hardware components of system 500. BIOS component 515 may also manage data flow between processor 510 and the various components, e.g., peripheral components 520, input/output control component 525, etc. BIOS component 515 may include a program or software stored in read-only memory (ROM), flash memory, or any other non-volatile memory.

Peripheral component(s) 520 may be any input or output device, or an interface for such devices, that is integrated into device 505. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 525 may manage data communication between processor 510 and peripheral component(s) 520, input devices 535, or output devices 545. Input/output control component 525 may also manage peripherals not integrated into device 505. In some cases, input/output control component 525 may represent a physical connection or port to the external peripheral.

Input device 535 may represent a device or signal external to device 505 that provides input to device 505 or its components. This may include a user interface or interface with or between other devices. In some cases, input device 535 may be a peripheral that interfaces with device 505 via peripheral component(s) 520 or may be managed by input/output control component 525.

Output device 545 may represent a device or signal external to device 505 configured to receive output from device 505 or any of its components. Examples of output device 545 may include a display, audio speakers, a printing device, another processor or printed circuit board, etc. In some cases, output device 545 may be a peripheral that interfaces with device 505 via peripheral component(s) 520 or may be managed by input/output control component 525.

The components of memory controller 140-b, device 505, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 6:
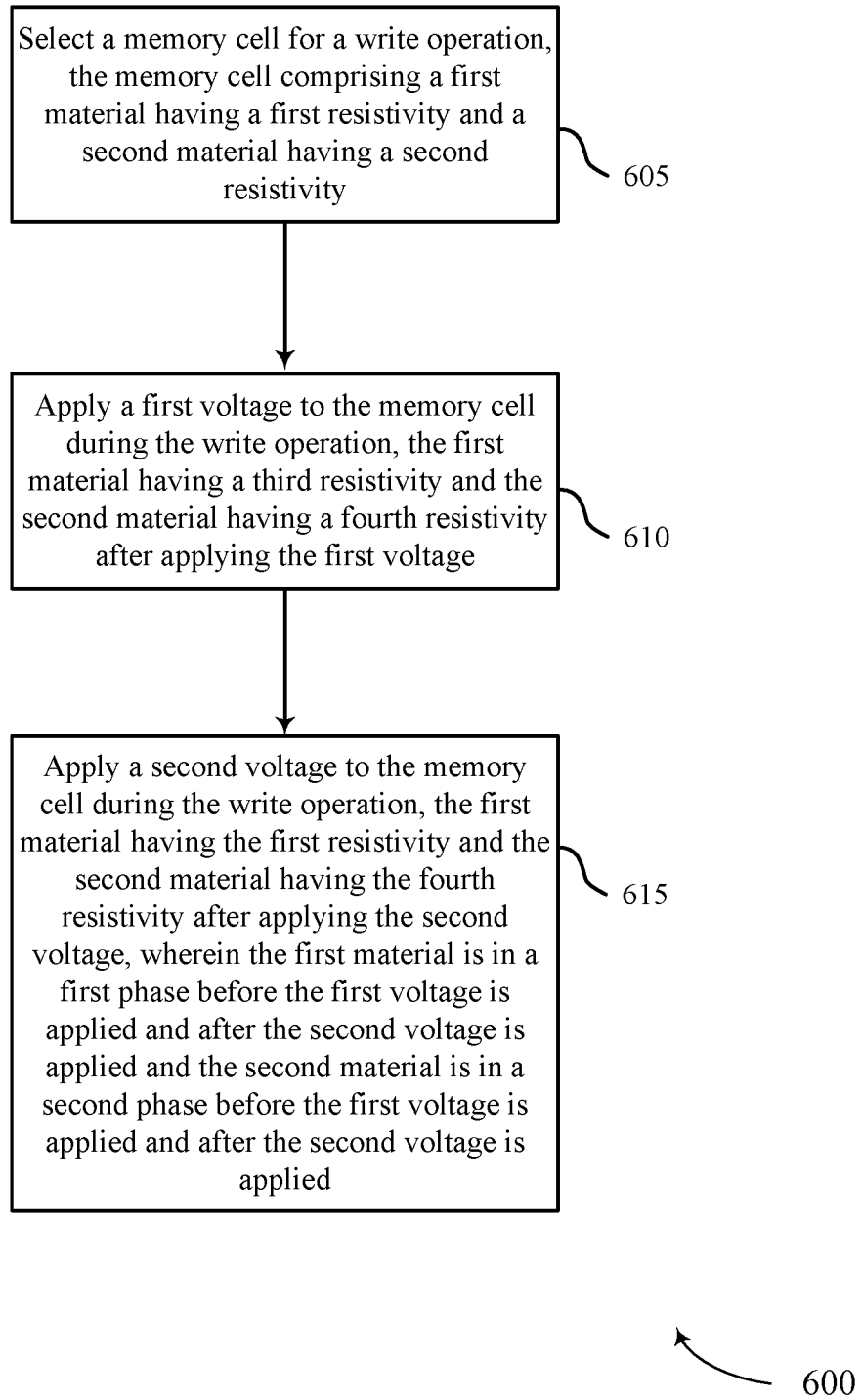
FIGS. 6 and 7 illustrate flowcharts of a method or methods for the operation of SBM in accordance with various embodiments of the present disclosure.

FIG. 6 illustrates a flowchart of a method or methods for the operation of SBM in accordance with various embodiments of the present disclosure. Method 600 may illustrate aspects of storing a non-binary logic value at a memory cell containing multiple segregable materials by individually programming a resistance of the different materials single using ion segregation principles.

At block 605, the method may include selecting a memory cell for a write operation, the memory cell comprising a first material having a first resistivity and a second material having a second resistivity, as described with reference to FIGS. 1-3. In certain examples, the operations of block 605 may be performed or facilitated by a memory controller, as described with reference to FIGS. 1, 4, and 5.

At block 610, the method may include applying a first voltage to the memory cell during the write operation, the first material having a third resistivity and the second material having a fourth resistivity after applying the first voltage, as described with reference to FIGS. 1-3. In certain examples, the operations of block 610 may be performed or facilitated by a memory controller, as described with reference to FIGS. 1, 4, and 5.

At block 615, the method may include applying a second voltage to the memory cell during the write operation, the first material having the first resistivity and the second material having the fourth resistivity after applying the second voltage, wherein the first material is in a first phase before the first voltage is applied and after the first voltage is applied and the second material is in a second phase before the first voltage is applied and after the second voltage is applied, as described with reference to FIGS. 1-3. In certain examples, the operations of block 615 may be performed or facilitated by a memory controller, as described with reference to FIGS. 1, 4, and 5.

In some examples, an apparatus as described herein may perform a method or methods, such as the method 600. The apparatus may include features, means, or instructions (e.g., a non-transitory computer-readable medium storing instructions executable by a processor) for selecting a memory cell for a write operation, the memory cell including a first material having a first resistivity and a second material having a second resistivity, applying a first voltage to the memory cell during the write operation, the first material having a third resistivity and the second material having a fourth resistivity after applying the first voltage, and applying a second voltage to the memory cell during the write operation, the first material having the first resistivity and the second material having the fourth resistivity after applying the second voltage, where the first material is in a first phase before the first voltage is applied and after the second voltage is applied and the second material is in a second phase before the first voltage is applied and after the second voltage is applied.

Some examples of the method, apparatuses, and non-transitory computer-readable medium described herein may further include operations, features, means, or instructions for determining a logic value of the memory cell based on a resistivity of the first material and a resistivity of the second material.

In some examples of the method, apparatuses, and non-transitory computer-readable medium described herein, a first combination of the first resistivity and the second resistivity corresponds to a first logic value, a second combination of the third resistivity and the fourth resistivity corresponds to a second logic value, and a third combination of the first resistivity and the fourth resistivity corresponds to a third logic value.

Some examples of the method, apparatuses, and non-transitory computer-readable medium described herein may further include operations, features, means, or instructions for identifying a logic value to store at the memory cell via the write operation and determining a polarity for the first voltage and a polarity for the second voltage based on the logic value.

In some examples of the method, apparatuses, and non-transitory computer-readable medium described herein, the first voltage may be based on a first glass transition temperature of the first material and the second voltage may be based on a second glass transition temperature of the second material, where the second glass transition temperature greater than the first glass transition temperature.

Some examples of the method, apparatuses, and non-transitory computer-readable medium described herein may further include operations, features, means, or instructions for selecting the memory cell for a read operation, applying a third voltage to the memory cell during the read operation, and determining a logic value stored by the memory cell based on applying the third voltage.

In some examples of the method, apparatuses, and non-transitory computer-readable medium described herein, a resistivity of the first material corresponds to a first threshold voltage and a resistivity of the second material corresponds to a second threshold voltage.

In some examples of the method, apparatuses, and non-transitory computer-readable medium described herein, a magnitude of the first voltage may be higher than a magnitude of the second voltage.

In some examples of the method, apparatuses, and non-transitory computer-readable medium described herein, the first voltage may have a first polarity and the second voltage may have a second polarity.

Figure 7:
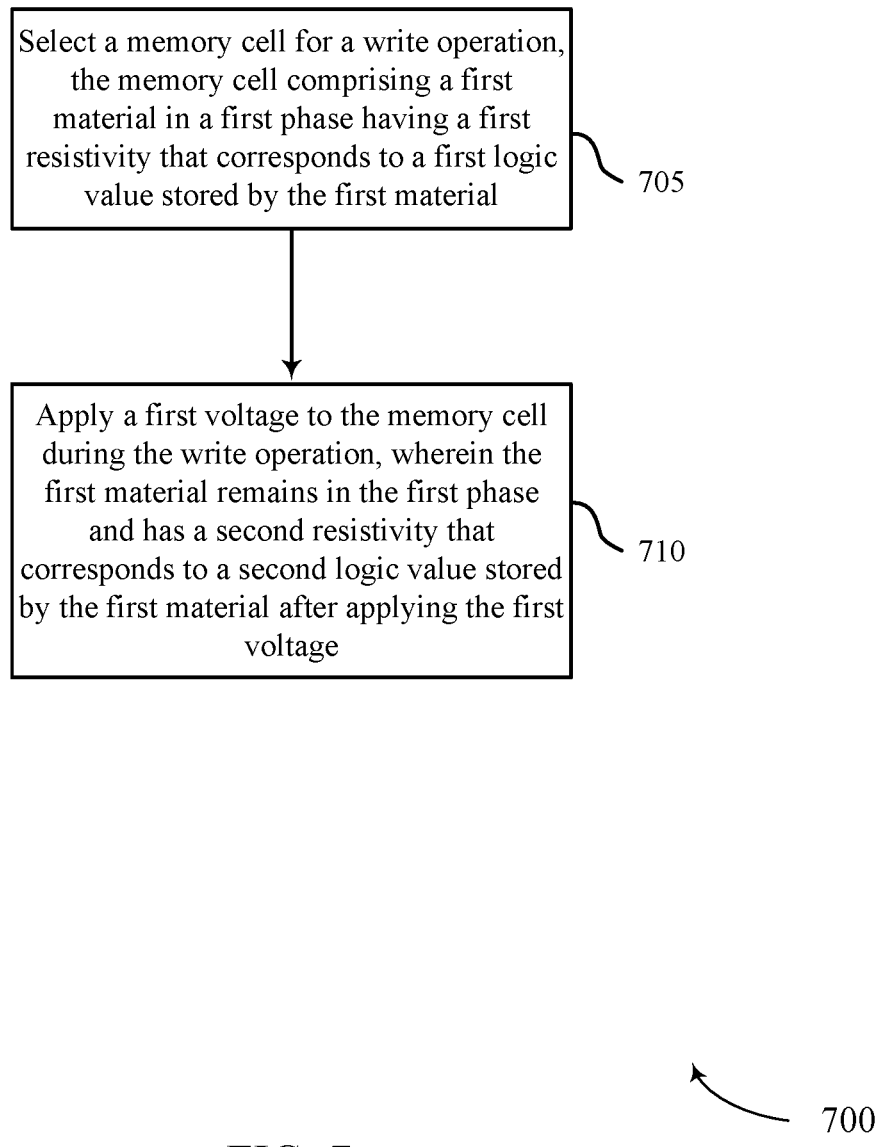

FIG. 7 illustrates a flowchart of a method or methods for the operation of SBM in accordance with various embodiments of the present disclosure. Method 700 may illustrate aspects of programming a resistance of a memory cell containing a single segregable material by causing ion movement within the material.

At block 705, the method may include selecting a memory cell for a write operation, the memory cell comprising a first material in a first phase having a first resistivity that corresponds to a first logic value stored by the first material, as described with reference to FIGS. 1-3. In certain examples, the operations of block 705 may be performed or facilitated by a memory controller, as described with reference to FIGS. 1, 4, and 5.

At block 710, the method may include applying a first voltage to the memory cell during the write operation, wherein the first material remains in the first phase and has a second resistivity that corresponds to a second logic value stored by the first material after applying the first voltage, as described with reference to FIGS. 1-3. In certain examples, the operations of block 710 may be performed or facilitated by a memory controller, as described with reference to FIGS. 1, 4, and 5.

In some examples, an apparatus as described herein may perform a method or methods, such as the method 600. The apparatus may include features, means, or instructions (e.g., a non-transitory computer-readable medium storing instructions executable by a processor) for selecting a memory cell for a write operation, the memory cell including a first material in a first phase having a first resistivity that corresponds to a first logic value stored by the first material and applying a first voltage to the memory cell during the write operation, where the first material remains in the first phase and has a second resistivity that corresponds to a second logic value stored by the first material after applying the first voltage.

Some examples of the method, apparatuses, and non-transitory computer-readable medium described herein may further include operations, features, means, or instructions for applying a second voltage to the memory cell during a second write operation, the first material remaining in the first phase and having the first resistivity after the second voltage may be applied.

In some examples of the method, apparatuses, and non-transitory computer-readable medium described herein, the first voltage may have a first polarity and the second voltage may have a second polarity, and where the first resistivity may be lower than the second resistivity.

In some examples of the method, apparatuses, and non-transitory computer-readable medium described herein, the memory cell includes a second material in a second phase and having a third resistivity that corresponds to a third logic value stored by the second material, and where a combination of the second resistivity and the third resistivity corresponds to a non-binary logic value stored by the memory cell.

Some examples of the method, apparatuses, and non-transitory computer-readable medium described herein may further include operations, features, means, or instructions for applying a second voltage to the memory cell during the write operation, the first material remaining in the first phase and having the first resistivity and the second material remaining in the second phase and having the fourth resistivity after the second voltage may be applied.

In some examples of the method, apparatuses, and non-transitory computer-readable medium described herein, the second material in the second phase may have the third resistivity after the first voltage may be applied.

In some examples of the method, apparatuses, and non-transitory computer-readable medium described herein, the first phase may be an amorphous phase and the second phase may be a crystalline phase. In other examples of the method, apparatuses, and non-transitory computer-readable medium described herein, the first phase may be an amorphous phase and the second phase may be an amorphous phase.

In some examples of the method, apparatuses, and non-transitory computer-readable medium described herein, the first material may be programmable with a first current and the second material may be programmable with a second current, the first current being lower than the second current.

In some examples of the method, apparatuses, and non-transitory computer-readable medium described herein, ions of the first material move toward an end of the first material after the first voltage may be applied, and where a value of the second resistivity may be based on the ion movement.

It should be noted that the methods described above describe possible implementations, and that the operations and the steps may be rearranged or otherwise modified and that other implementations are possible. Furthermore, embodiments from two or more of the methods may be combined.

In some examples, an apparatus or device may perform aspects of the functions described herein using general, or special-purpose hardware. The apparatus or device may include a memory cell including a first material in a first phase and a second material in a second phase; a first access line in electronic communication with the memory cell; and a second access line in electronic communication with the memory cell. In some cases, a resistivity of the first material is programmable within the first phase using an amount of current above a first threshold and a resistivity of the second material is programmable within the second phase using an amount of current above a second threshold.

In some examples of the apparatus or device, the memory cell includes a memory element comprising the first material and the second material, where the first material is configured to store a first bit of a logic value and the second material configured to store a second bit of the logic value.

In some examples of the apparatus or device, a first bandgap energy of the first material is lower than a second bandgap energy of the second material, a resistivity of the first material is programmable within the first phase, and a resistivity of the second material is programmable within the second phase with an amount of current below a third threshold. The third threshold may be based at least in part on the first bandgap and the second bandgap.

In some examples of the apparatus or device, a first glass transition temperature of the first material is between 350 Kelvin and 400 Kelvin and a second glass transition temperature of the second material is between 400 Kelvin and 450 Kelvin In some examples of the apparatus or device, a first resistivity of the first material corresponds to a first segregated state of ions within the first material and a second resistivity of the first material corresponds to a second segregated state of ions within the first material. And a third resistivity of the second material corresponds to a third segregated state of ions within the second material and a fourth resistivity of the second material corresponds to a fourth segregated state of ions within the second material.

In some examples of the apparatus or device, the first phase is an amorphous phase and the second phase is a crystalline phase and the first threshold is lower than the second threshold. In other examples of the apparatus or device, the first phase is an amorphous phase and the second phase is an amorphous phase and the first threshold is lower than the second threshold.

In some examples of the apparatus or device, a resistivity of the first material corresponds to a first threshold voltage of the first material and a resistivity of the second material corresponds to a second threshold voltage of the second material.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (e.g., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

As used herein, the term "short," "shorted, or "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
    selecting a memory cell for a write operation, the memory cell comprising a first material having a first resistivity and a second material having a second resistivity;
    applying a first voltage to the memory cell during the write operation, the first material having a third resistivity and the second material having a fourth resistivity after applying the first voltage; and
    applying a second voltage to the memory cell during the write operation, the first material having the first resistivity and the second material having the fourth resistivity after applying the second voltage, wherein the first material is in a first phase before the first voltage is applied and after the second voltage is applied and the second material is in a second phase before the first voltage is applied and after the second voltage is applied.

2. The method of claim 1, further comprising:
    determining a logic value of the memory cell based at least in part on a resistivity of the first material and a resistivity of the second material.

3. The method of claim 2, wherein a first combination of the first resistivity and the second resistivity corresponds to a first logic value, a second combination of the third resistivity and the fourth resistivity corresponds to a second logic value, and a third combination of the first resistivity and the fourth resistivity corresponds to a third logic value.

4. The method of claim 1, further comprising:
    identifying a logic value to store at the memory cell via the write operation; and
    determining a polarity for the first voltage and a polarity for the second voltage based at least in part on the logic value.

5. The method of claim 1, wherein the first voltage is based at least in part on a first glass transition temperature of the first material; and wherein the second voltage is based at least in part on a second glass transition temperature of the second material, the second glass transition temperature greater than the first glass transition temperature.

6. The method of claim 1, further comprising:
    selecting the memory cell for a read operation; and
    applying a third voltage to the memory cell during the read operation; and
    determining a logic value stored by the memory cell based at least in part on applying the third voltage.

7. The method of claim 1, wherein a resistivity of the first material corresponds to a first threshold voltage and a resistivity of the second material corresponds to a second threshold voltage.

8. The method of claim 1, wherein a magnitude of the first voltage is higher than a magnitude of the second voltage.

9. The method of claim 1, wherein the first voltage has a first polarity and the second voltage has a second polarity.

10. A method, comprising:
    selecting a memory cell for a write operation, the memory cell comprising a first material operable to be configured in any of a plurality of phases, wherein the plurality of phases comprises an amorphous phase and a crystalline phase, and wherein the first material is in a first phase of the plurality of phases and has having a first resistivity that corresponds to a first logic value stored by the first material; and
    applying a first voltage to the memory cell during the write operation such that at least a portion of ions within the first material move toward an end of the first material, wherein upon application of the first voltage the first material remains in the first phase and has a second resistivity that corresponds to a second logic value stored by the first material after applying the first voltage.

11. The method of claim 10, further comprising:
    applying a second voltage to the memory cell during a second write operation, the first material remaining in the first phase and having the first resistivity after the second voltage is applied.

12. The method of claim 11, wherein the first voltage has a first polarity and the second voltage has a second polarity, and wherein the first resistivity is lower than the second resistivity.

13. The method of claim 10, wherein the memory cell comprises a second material operable to be configured in any of the plurality of phases, wherein the second material is in a second phase of the plurality of phases and has having a third resistivity that corresponds to a third logic value stored by the second material, and wherein a combination of the second resistivity and the third resistivity corresponds to a non-binary logic value stored by the memory cell.

14. The method of claim 13, wherein the second material remains in the second phase and has a fourth resistivity after the first voltage is applied, the method further comprising:
    applying a second voltage to the memory cell during the write operation, the first material remaining in the first phase and having the first resistivity and the second material remaining in the second phase and having the fourth resistivity after the second voltage is applied.

15. The method of claim 13, wherein the second material in the second phase has the third resistivity after the first voltage is applied.

16. The method of claim 13, wherein the first phase is the amorphous phase and the second phase is the crystalline phase.

17. The method of claim 13, wherein the first material is programmable with a first current and the second material is programmable with a second current, the first current being lower than the second current.

18. The method of claim 10, wherein a value of the second resistivity is based at least in part on the movement of the ions within the first material.

* * * * *